United States Patent
Withanawasam et al.

(10) Patent No.: US 8,316,552 B1
(45) Date of Patent: Nov. 27, 2012

(54) SYSTEMS AND METHODS FOR THREE-AXIS SENSOR CHIP PACKAGES

(75) Inventors: Lakshman Withanawasam, Maple Grove, MN (US); Ryan W. Rieger, San Jose, CA (US); Bharat B Pant, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/101,492

(22) Filed: May 5, 2011

(51) Int. Cl.
  *G01C 17/00* (2006.01)
  *G01R 33/02* (2006.01)

(52) U.S. Cl. .................. 33/355 R; 324/247

(58) Field of Classification Search ........... 33/355 R; 324/247
  See application file for complete search history.

(56) References Cited

U.S. PATENT DOCUMENTS

| | | | |
|---|---|---|---|
| 4,163,326 A * | 8/1979 | Edwards | 33/361 |
| 4,306,436 A * | 12/1981 | Schulz et al. | 72/21.1 |
| 5,521,500 A | 5/1996 | Schuhl et al. | |
| 6,556,007 B1 * | 4/2003 | Itabashi et al. | 324/252 |
| 6,918,186 B2 * | 7/2005 | Ash et al. | 33/313 |
| 7,095,226 B2 | 8/2006 | Wan et al. | |
| 7,126,330 B2 | 10/2006 | Peczalski | |
| 7,145,330 B2 | 12/2006 | Xiao | |
| 7,237,437 B1 | 7/2007 | Fedora | |
| 7,271,586 B2 | 9/2007 | Bohlinger et al. | |
| 7,509,748 B2 * | 3/2009 | Xue et al. | 33/356 |
| 7,536,909 B2 | 5/2009 | Zhao | |
| 7,559,148 B2 * | 7/2009 | Hayama | 33/355 R |
| 7,671,478 B2 | 3/2010 | Wathanawasam | |
| 7,830,000 B2 | 11/2010 | Eichelberger et al. | |
| 7,870,678 B2 * | 1/2011 | Kwon et al. | 33/355 R |
| 2010/0223797 A1 * | 9/2010 | Peczalski | 33/355 R |
| 2011/0234218 A1 | 9/2011 | Lagouge | |

FOREIGN PATENT DOCUMENTS

EP 2194391 6/2010

OTHER PUBLICATIONS

Babinetz, "Wire Bonding Solutions for 3-D Stacked Die Packages".
"Comparison of Hall Effect and MR Technologies", "Sensing and Control: Appendix E", Oct. 15, 1998, pp. 101-102, Publisher: Honeywell.

(Continued)

*Primary Examiner* — Christopher Fulton
(74) *Attorney, Agent, or Firm* — Fogg & Powers LLC

(57) ABSTRACT

Systems and methods for three-axis sensor chip packages are provided. In one embodiment, a directional sensor package comprises: a base; a first sensor die mounted to the base, the first sensor die having a first active sensor circuit and a first plurality of metal pads electrically coupled to the first active sensor circuit; a second sensor die mounted to the base, the second sensor die having a second active sensor circuit located on a first surface, and a second plurality of metal pads electrically coupled to the second active sensor circuit located on a second surface. The second sensor die is positioned such that the second active sensor circuit is oriented orthogonally with respect to the first active sensor circuit region and is perpendicular to the base. The second surface is adjacent to the first surface and angled with respect to a plane of the first surface.

20 Claims, 4 Drawing Sheets

OTHER PUBLICATIONS

Caruso, Michael J., "Applications of Magnetoresistive Sensors in Navigation Systems", "Available at http://www.ssec.honeywell.com/position-sensors/datasheets/sae.pdf accessed Apr. 7, 2011", Feb. 16, 1998, pp. 18, Publisher: Honeywell Inc.

Fang et al., "Design of a Wireless Assisted Pedestrian Dead Reckoning System—The NavMote Experience", "IEEE Transactions on Instrumentation and Measurement", Dec. 2005, pp. 2342-2358, vol. 54, No. 6, Publisher: IEEE.

Garcia, "Hall Effect Sensors Magneto Resistive Sensors Magneto Resistive Detector", "Available at http://sandoval-gonzalez.com/5_hall.pdf accessed Apr. 7, 2011", Oct. 14, 2009, pp. 126.

"Hall Effect Sensing and Application", "Micro Switch Sensing and Control", Oct. 14, 1998, pp. 1-126, Publisher: Honeywell.

Jander et al., "Magnetoresistive Sensors for Nondestructive Evaluation", "Presented at the 10th SPIE International Symposium, Nondestructive Evaluation for Health Monitoring and Diagnostics, Conference 5770", Mar. 2005, pp. 1-13, Publisher: NVE Corporation.

Popovic et al., "Bridging the Gap Between AMR, GMR, and Hall Magnetic Sensors", "Proceedings of the 23rd International Conference on Microelectronics, May 12-15, 2002", May 2002, pp. 55-58, vol. 1, Publisher: IEEE, Published in: Yugoslavia.

U.S. Patent and Trademark Office, "Office Action", "U.S. Appl. No. 13/116,844", Aug. 14, 2012.

U.S. Patent and Trademark Office, "Restriction Requirement", "U.S. Appl. No. 13/156,758", Aug. 7, 2012.

* cited by examiner

SYSTEMS AND METHODS FOR THREE-AXIS SENSOR CHIP PACKAGES

BACKGROUND

The need for magnetic sensors that detect all components of a magnetic field in three-dimensions is ever increasing due to their application in cell phones and other portable electronics as compass devices. Because of physical size constraints and for the ease of manufacture, the preferred solution in the art today is to integrate three sensors components into a single integrated circuit package. Any such integration of the sensors, to be a viable solution in the market space, needs to be cost competitive.

With magnetic sensor technology (such as Anisotropic Magnetoresistance (AMR) sensors, for example) there are several critical aspects that prevent it from reaching the most preferred commercial option. Cost and physical height of the resulting sensors are two of those aspects. Single die monolithic three-axis magnetic sensor device does not exist currently. This deficiency has been overcome by utilizing two die solutions. For example, a single die sensitive in two orthogonal directions is used to achieve in-plane 2-axis sensing. Then, a second sensor die is rotated so that it's sensing axis is orthogonal to that of the former die. The latter die is mounted via reflow soldering on to a substrate. However, such solutions to date have been expensive and difficult to manufacture because of the small die size, expensive multi-step processing needed to create interconnections to the vertically oriented sensor.

For the reasons stated above and for other reasons stated below which will become apparent to those skilled in the art upon reading and understanding the specification, there is a need in the art for improved systems and methods for three-axis sensor packages.

SUMMARY

The Embodiments of the present invention provide methods and systems for three-axis sensor packages and will be understood by reading and studying the following specification.

In one embodiment, a directional sensor package comprises: a base; a first sensor die mounted to the base, the first sensor die having a first active sensor circuit and a first plurality of metal pads electrically coupled to the first active sensor circuit; a second sensor die mounted to the base, the second sensor die having a second active sensor circuit located on a first surface, and a second plurality of metal pads electrically coupled to the second active sensor circuit located on a second surface. The second sensor die is positioned such that the second active sensor circuit is oriented orthogonally with respect to the first active sensor circuit region and is perpendicular to the base. The second surface is adjacent to the first surface and angled with respect to a plane of the first surface.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

Figure 1A:
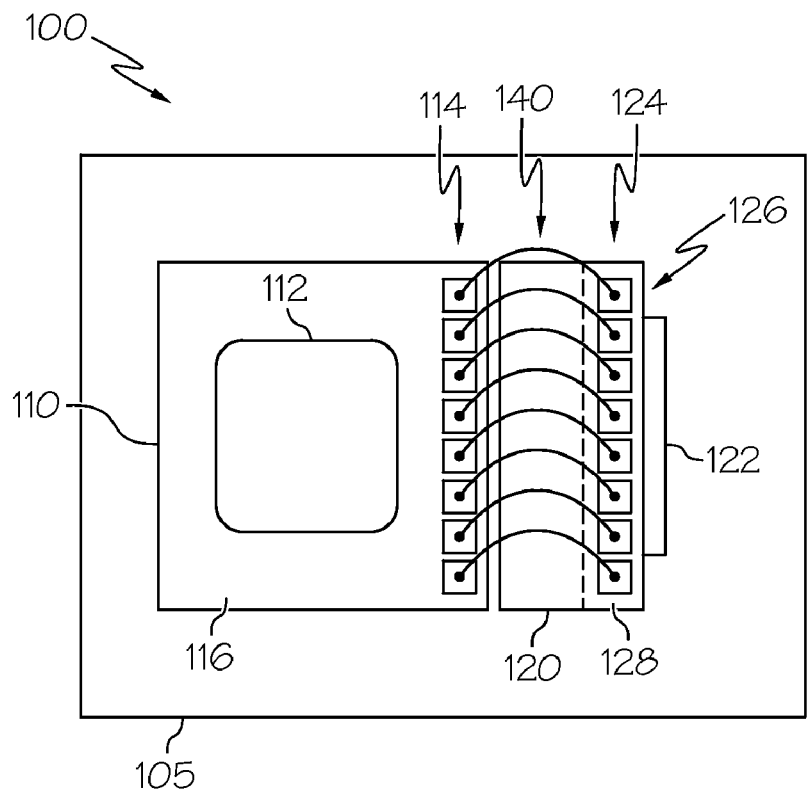
FIGS. 1A-1D are diagrams illustrating a three-axis sensor of one embodiment of the present invention.

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide for a three-axis sensor having both a non-rotated die and a 90-degree rotated sensor die within a sensor package. The non-rotated die is fabricated as is practiced currently so that its active sensor circuit (that is, the region of the die where the sensing elements are fabricated) is located on its top surface and co-planar with the sensor's electrical connection pads. The rotated die is fabricated to have two different surfaces. The first surface is fabricated to comprise the die's active sensor circuit. The second surface is fabricated by etching into the first surface to form an angled surface adjacent to the first surface. The second angled surface is fabricated to comprise metal pads providing electrical interconnectivity with the active sensor circuit formed on the first surface.

Interconnectivity between the non-rotated and rotated die is achieved using standard wirebonding techniques to establish wirebonds between the metal connection pads on the angled surface of the rotated die and metal connection pads located on the active sensor circuit surface of the non-rotated die. As such, the need to create electrical connections directly to vertical connections pads on the rotated die are avoided. Further, the ability to wirebond interconnections for the two die avoids the need for providing soldered bottom contact connections between the die and the package base, resulting in relatively simpler manufacturing processes. This in turn avoids sensor alignment errors which can result from reflow processing of soldered bottom contacts. Although it is contemplated that a typical application will include a horizontal sensor die having a two-axis in-plane sensor with the vertical die including a single-axis sensor for out-of-plane measurements, embodiments of the present invention are not limited to such a configuration. For example, it is contemplated that a three-axis sensor can also be formed from a vertical die having a two-axis sensor (one axis will be in plane and one out-of-plane) and a horizontal die having a single-axis sensor oriented orthogonally to the two-axis sensor. Further, it is contemplated that in alternate embodiments, the sensors may comprise magnetic sensors (that is, sensors sensitive to magnetic fields), inertial sensors (such as accelerometers and/or gyroscopes) or combinations thereof.

Figure 1B:
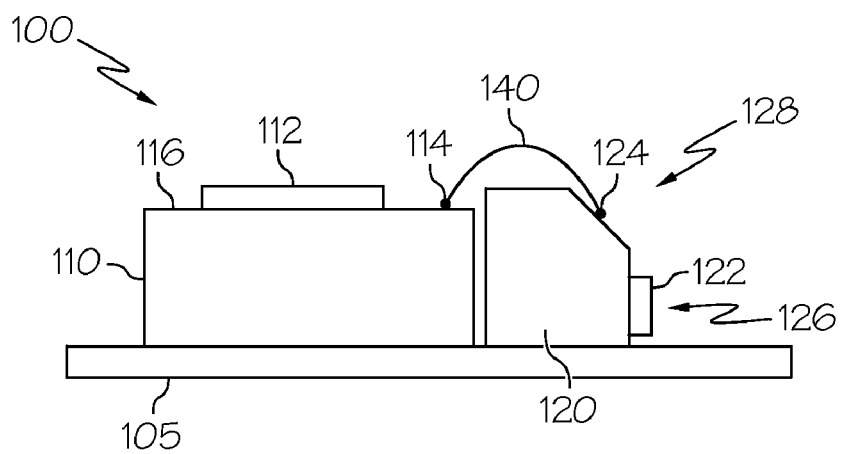

FIGS. 1A and 1B are diagrams illustrating a three-axis sensor 100 of one embodiment of the present invention. Three-axis sensor 100 comprises a first sensor die 110 having an active sensor circuit 112 and a plurality of metal pads 114 providing electrical interconnectivity with the active sensor circuit 112. The active sensor circuit 112 and the metal pads 114 are both formed on a single surface 116 of sensor die 110, which is oriented co-planar with respect to a base 105 of sensor 100. In alternate embodiments, the base 105 may be either a substrate, a frame, or another integrated circuit, depending of the package type used for the sensor.

As the term is used herein, a "package" is a term of art in integrated circuit technology referring specifically to a chip carrier (also known as a chip container or chip package) that functions as the protective container housing an integrated circuit or multiple integrated circuits. That is, a package is the housing that integrated circuit chips come in that provides for mechanical and electrical coupling of the integrated circuit to an external circuit, such as a printed circuit board. Electrical connections may be performed via either socket or surface mounting. As such, a package will usually provide metal leads or pads, which are sturdy enough to electrically and mechanically connect the fragile chip to the printed circuit board.

Three-axis sensor 100 further comprises a second sensor die 120 having an active sensor circuit 122 and a plurality of metal pads 124 providing electrical interconnectivity with the active sensor circuit 122. On sensor die 120, the active sensor circuit is formed on a first surface 126 that is oriented orthogonally to the surface 116 of sensor die 110. The metal pads 124 are formed on a second, angled, surface 128 that is etched from the first surface 126. As shown in FIG. 1B, the second die 120 is oriented on base 105 so that the active sensor circuit is perpendicular to base 105 and so metal pads 124 are at least partially facing away from base 105. This orientation permits wirebonds 140 to be connected to metal pads 124 using the same process used to connect wirebonds 140 to metal pads 114. In one embodiment, the angled surface 128 is angled in from the plane of surface 126 at least 45 degrees.

In one embodiment, die 110 and 120 are mounted to base 105 using standard die attachment processes. As would be appreciated by one of ordinary skill in the art upon reading this specification, die attachment is the step during semiconductor device fabrication in which a die is mounted and fixed to its package or support structure. In some embodiments, die 110 and 120 are eutectic bonded. In other embodiments, glues, tapes, or epoxy adhesives are used. In one embodiment, a die attach adhesive is used between die 110 and die 120 to secure the two die together. In addition to providing mechanical support that keeps the sensing axes of the die orthogonally oriented, inserting die attachment material between the two die serves to eliminate cavities within the package. Further, because electrical connections to die 110 and 120 are provided by metal pads 114 and 124 located on top of the respective die, the need to apply solder between the die 110 and base 105 to provide electrical connections is avoided.

As would be appreciated by one of ordinary skill in the art upon reading this specification, one significant benefit is that the angled surface 128 allows for the installation of wirebonds on the vertically rotated die 120 using the same process as used for the non-rotated die 110. That is, wirebonds for both die can be installed directly from the above. On a horizontal surface, contacts formed on the die 110 are on top surface 116 of the die. Therefore, normal wirebonding techniques can be used. On the rotated die 120, the circuit 122 formed on the die is rotated to the side, vertical to the base 105. Normal wirebonding techniques do not permit wirebonding to such a vertical surface. Thus, having angled surface 128 provides sufficient access from above to the metal contacts 124 to perform wirebonding from above.

Figure 1C:
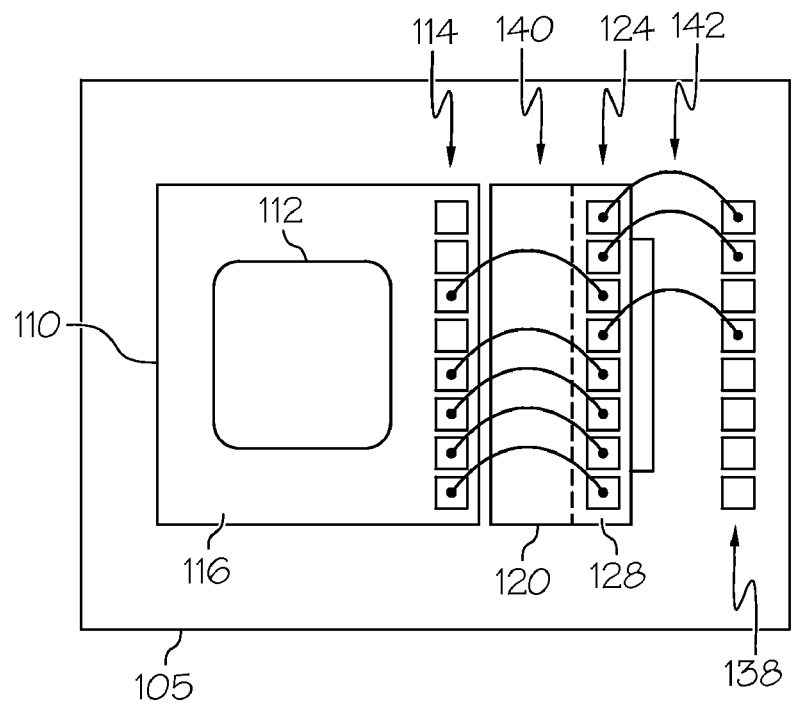
Figure 1D:
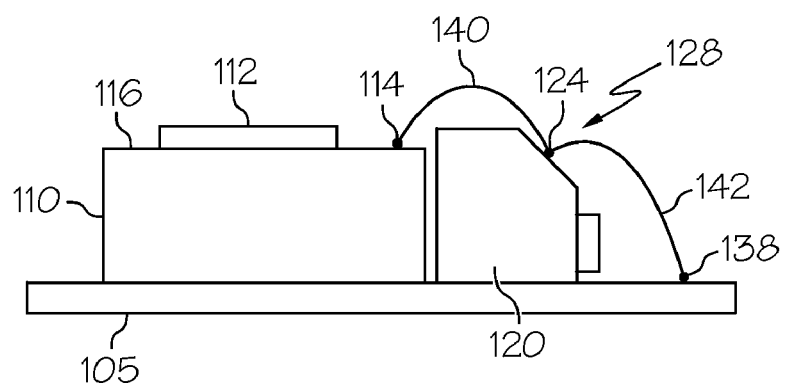

As illustrated in FIGS. 1C and 1D, in addition to having wirebond connections 140 between dies 110 and 120, in one or more implementations, wirebond connections 142 are also formed between the metal pads 124 located on the angled surface 128 and metal pads 138 formed on base 105. As would be appreciated by one of ordinary skill in the art upon reading this specification, just as the having the metal pads 124 on angled surface 128 facilitates using normal wireboding techniques to interconnect dies 110 and 120, it also facilitates using normal wireboding techniques to interconnect die 120 to other circuits because of the accessibility of metal pads 124 from above.

Figure 2:
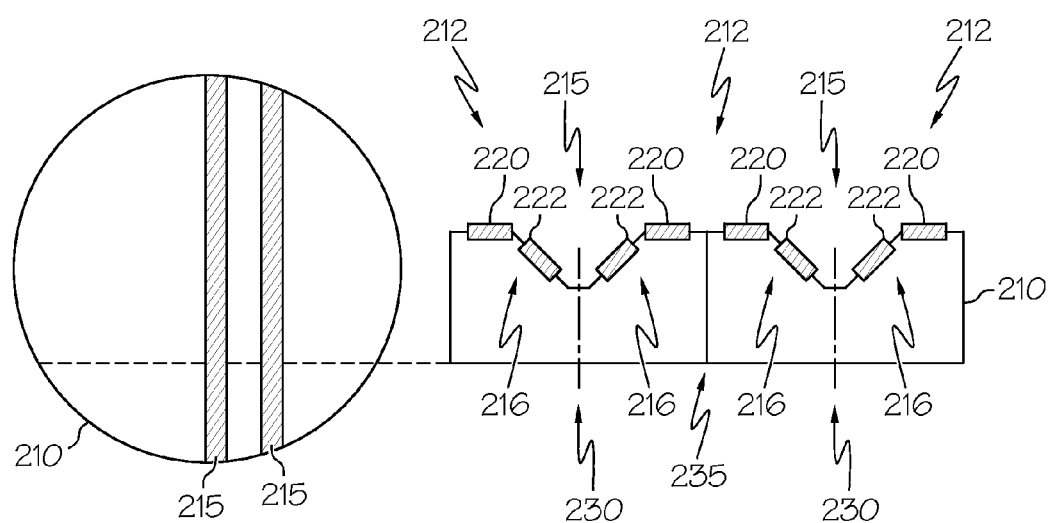
FIG. 2 is a diagram illustrating a technique for fabricating a vertical die of one embodiment of the present invention.

FIG. 2 illustrates a technique of one embodiment of the present invention for fabricating a vertical die such as die 120. In the context of creating a three-axis sensor, it is presumed that the horizontal die is processed using current fabrication technology and for that reason is not discussed further.

The vertical sensor die is fabricated from a silicon wafer 210 to have two different surfaces 212 and 216 where circuit elements are deposited. The vertical sensor die is formed from a starting wafer material 210 where groves 215 are formed on the surface of the wafer 210 by applying a selective etch process (such as by using potassium hydroxide, KOH) to the wafer 210. On non coplanar angled surfaces 216 formed within the grove 215 by the etching process, surfaces are created for fabricating metal pads 222 that will be used for interconnecting the vertical sensor to other circuits. Active sensor circuits 220 are formed on the non-grove horizontal surface 212 of the wafer 210. Deposition of the active sensor circuits 220 and the metallization of pads 222 utilize the same wafer fabrication process as would be used for the fabricating the horizontal sensor. The wafers 210 are singulated in a normal manner to obtain individual die, now having a horizontal active surface and a slanted surface having metalized bond pads. This die is then rotated 90 degrees so that the active sensor circuit is vertical and can be mounted within a package orthogonally to the active sensor circuit of the horizontal die. In addition to facilitating the installation of wirebond connections, because the metal bond pads 222 are at an angle to the vertical, overall height of the vertical sensor package is reduced.

Figure 3:
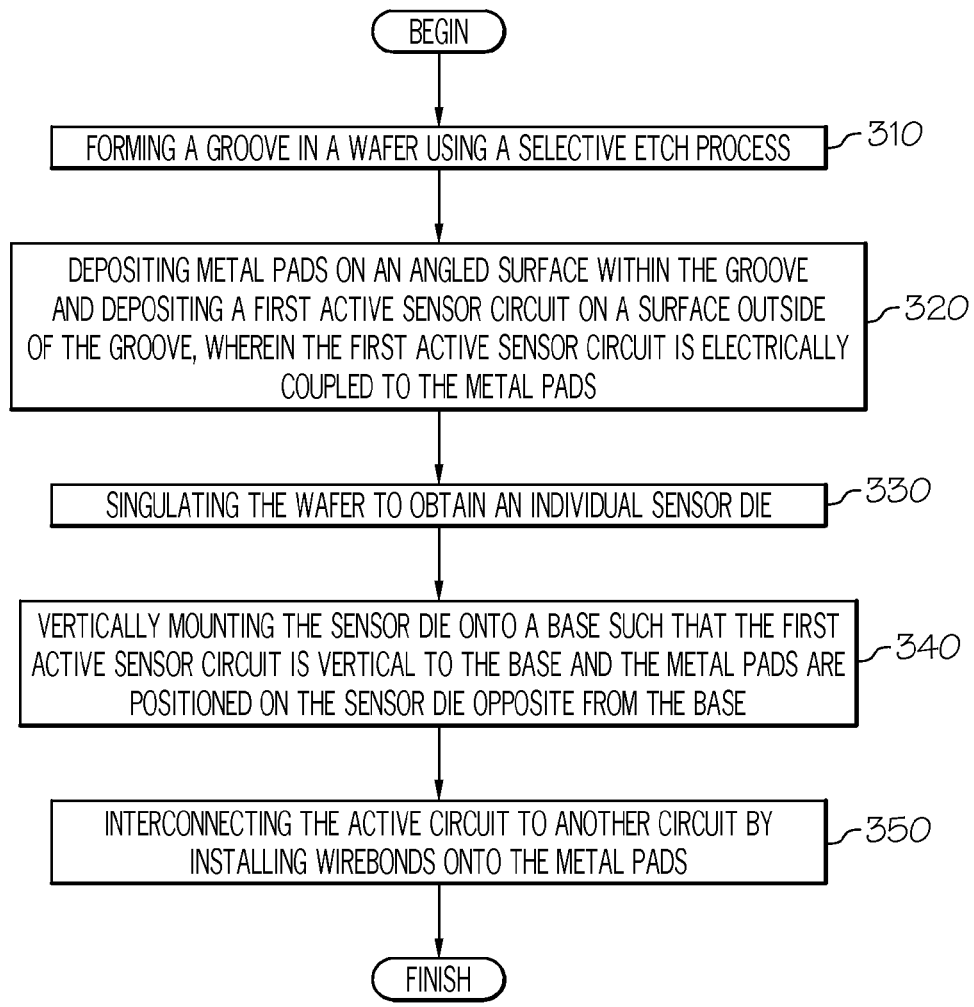
FIG. 3 is a flow chart illustrating a method of one embodiment of the present invention.

FIG. 3 is a flow chart illustrating a process of one embodiment of the present invention for fabricating a three-axis sensor having a vertical sensor die comprising a first surface for an active sensor circuit, and a second angled surface that includes metal pads. In one application of the method of FIG. 3, this vertical die is combined with a horizontal die to form the three-axis sensor such as illustrated in FIGS. 1A-1D. In one embodiment, the process of FIG. 3 provides for processing a wafer to obtain a vertical sensor, such as described with respect to FIG. 2.

The process starts at 310 with forming a groove in a wafer using a selective etch process. The process proceeds to 320 with depositing metal pads on an angled surface within the groove and depositing a first active sensor circuit on a surface outside of the groove, wherein the first active sensor circuit is electrically coupled to the metal pads. In this step, the same process steps for depositioning the active sensor circuit and metal pads may be used as for creating a horizontal sensor wafer. In one embodiment, the active sensor circuit comprises a single-axis sensor. In another embodiment, the active sensor circuit comprises a two-axis sensor.

The process then proceeds to 330 with singulating the wafer to obtain an individual sensor die. As shown in FIG. 2, in one embodiment, a first singulation cut 230 is performed at the base of the grooves 215 between sets of metal pads 222 formed on the grove walls while a second singulation cut 235 is perform between active sensor circuits 220 formed on the non-grove portion of the wafer 210. The wafer is singulated in the horizontal direction as well to provide the individual sensor die. The process proceeds to 340 with vertically mounting the sensor die onto a base such that the active sensor circuit is vertical to the base and the metal pads face away from the base. In this mounting, the sensor die is oriented to have a sensing axis that points in a direction that is normal with respect to the plane of the base. The singulated die can be die-attached to a substrate or cavity of a package or to an adjacent die using the back side of the silicon wafer and/or the sawn side so as to expose the pad metallization.

The process then proceeds to 350 with interconnecting the active sensor circuit to another circuit by installing wirebonds onto the metal pads. In this step the vertical die can be wire bonded to another die, or to the substrate, or cavity fingers (such as shown in FIGS. 1A-1D for example). In one embodiment, the resulting three-axis sensor is sealed within a package such as, but not limited to, an quad flat no lead (QF-N) package type using copper metalize lead frame, or a Dual Flat No leads (DF-N) package.

Since this process eliminates the need for reflow processing, it is a low cost path and the single pass silicon fabrication process eliminates additional steps in creating orthogonal bondable contact pads. In one embodiment, since the vertical sensor die does not need to undergo reflow processing, the process further comprises thinning the vertical sensor die. This step will further reduce the overall package dimensions leading to further cost reduction.

The underlying technology used to implement the sensors encompassed by embodiments of the present invention is not limited to Anisotropic Magnetoresistance (AMR) sensors but may be practiced using other technologies including both in-plane and out-of-plane directional sensors. For example, any of the embodiments discussed above may be implemented using Magneto-Resistive (MR) sensors (including, for example, anisotropic magneto-resistance (AMR), Giant Magneto-Resistance (GMR), and Tunnel Magneto-resistance (TMR) sensors), Magneto-Inductive (MI) sensors, Hall effect sensors and/or fluxgate sensors.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A directional sensor package, the sensor package comprising:
    a base;
    a first sensor die mounted to the base, the first sensor die having a first active sensor circuit and a first plurality of metal pads electrically coupled to the first active sensor circuit;
    a second sensor die mounted to the base, the second sensor die having a second active sensor circuit located on a first surface, and a second plurality of metal pads electrically coupled to the second active sensor circuit, the second plurality of metal pads located on a second surface;
    wherein the second sensor die is positioned such that the second active sensor circuit is oriented orthogonally with respect to the first active sensor circuit region and is perpendicular to the base;
    wherein the second surface is adjacent to the first surface and angled with respect to a plane of the first surface.

2. The sensor package of claim 1, wherein the first active sensor circuit comprises a two-axis sensor; and
    wherein the second active sensor circuit comprises a one-axis sensor oriented orthogonally with respect to the two-axis horizontal sensor.

3. The sensor package of claim 1, wherein second active sensor circuit comprises a two-axis sensor; and
    wherein the first active sensor circuit comprises a one-axis sensor oriented orthogonally with respect to the two-axis sensor.

4. The sensor package of claim 1, further comprising:
    one or more wirebond connections interconnecting the first plurality of metal pads of the first sensor die with the second plurality of metal pads of the second sensor die.

5. The sensor package of claim 1, further comprising:
    one or more wirebond connections interconnecting the second plurality of metal pads of the second sensor die with one or more metal pads formed on the base.

6. The sensor package of claim 1, further comprising die attachment material mechanically coupling the first sensor die and the second sensor die to the base.

7. The sensor package of claim 1, further comprising die attachment material mechanically coupling the first sensor die to the second sensor die.

8. The sensor package of claim 1, wherein the first active sensor circuit and the second active sensor circuit comprise magnetic sensors or inertial sensors.

9. A method for fabricating a directional sensor, the method comprising:
    forming a groove in a wafer using a selective etch process;
    depositing metal pads on an angled surface within the groove and depositing a first active sensor circuit on a surface outside of the groove, wherein the first active sensor circuit is electrically coupled to the metal pads;
    singulating the wafer to obtain an individual sensor die;
    vertically mounting the sensor die onto a base such that the first active sensor circuit is vertical to the base and the metal pads are positioned on the sensor die opposite from the base;
    interconnecting the active sensor circuit to another circuit by installing wirebonds onto the metal pads.

10. The method of claim 9, further comprising:
    mounting a second sensor die having a second active sensor circuit to the base such that the second active sensor circuit is oriented orthogonal with respect to the first active sensor circuit.

11. The method of claim 10, further comprising:
    wirebonding an electrical connection between the metal pads and the second active sensor circuit of the second sensor die.

12. The method of claim 10, wherein the first active sensor circuit comprises a two-axis sensor; and
    wherein the second active sensor circuit comprises a one-axis sensor oriented orthogonally to at least one axis of the two-axis horizontal sensor.

13. The method of claim 10, wherein second active sensor circuit comprises a two-axis sensor; and
    wherein the first active sensor circuit comprises a one-axis sensor oriented orthogonally to at least one axis of the two-axis sensor.

14. The method of claim 10, further comprising mechanically coupling the first sensor die to the second sensor die using a die attachment material.

15. The method of claim 9, further comprising mechanically coupling the first sensor die to the base using a die attachment material.

16. The method of claim 9, further comprising:
wirebonding an electrical connection from the metal pads to the base.

17. The method of claim 9, wherein the first active sensor circuit comprise either a magnetic sensor or an inertial sensor.

18. A vertical sensor die for use in a three-axis sensor package, the vertical sensor die comprising:
an active sensor circuit located on a first surface; and
a plurality of metal pads electrically coupled to the active sensor located on a second surface;
wherein the second surface is adjacent to the first surface and angled with respect to a plane of the first surface.

19. The vertical sensor die of claim 18, wherein the first active sensor circuit comprises either a single-axis sensor or a two-axis sensor.

20. The vertical sensor die of claim 18, wherein the second surface is angled inward from the plane of the first surface at least 45 degrees.

* * * * *